US007143326B2

(12) United States Patent
Fan et al.

(10) Patent No.: US 7,143,326 B2
(45) Date of Patent: Nov. 28, 2006

(54) TEST SYSTEM ALGORITHMIC PROGRAM GENERATORS

(75) Inventors: Daniel Fan, Los Altos, CA (US); Kris Sakaitani, San Jose, CA (US); Burnell G. West, Fremont, CA (US)

(73) Assignee: Credence Systems Corporation, Milpitas, CA (US)

( * ) Notice: Subject to any disclaimer, the term of this patent is extended or adjusted under 35 U.S.C. 154(b) by 514 days.

(21) Appl. No.: 10/102,526

(22) Filed: Mar. 19, 2002

(65) Prior Publication Data

US 2002/0188902 A1 Dec. 12, 2002

Related U.S. Application Data

(60) Provisional application No. 60/277,795, filed on Mar. 21, 2001, provisional application No. 60/277,675, filed on Mar. 20, 2001.

(51) Int. Cl.
*G01R 31/28* (2006.01)
*G06F 11/00* (2006.01)
(52) U.S. Cl. ..................................... 714/738
(58) Field of Classification Search ............... 714/739, 714/738, 724; 711/169; 716/2, 4, 6, 8
See application file for complete search history.

(56) References Cited

U.S. PATENT DOCUMENTS

| 5,491,673 | A |   | 2/1996  | Okayasu              |         |
|-----------|---|---|---------|----------------------|---------|
| 5,535,164 | A | * | 7/1996  | Adams et al. ......... | 365/201 |
| 5,581,177 | A |   | 12/1996 | Hussey et al.        |         |
| 5,835,969 | A |   | 11/1998 | Inagaki et al.       |         |
| 5,883,905 | A |   | 3/1999  | Eastburn             |         |
| 6,237,021 | B1| * | 5/2001  | Drummond ............ | 709/201 |
| 6,249,889 | B1|   | 6/2001  | Rajsuman et al.      |         |
| 6,266,750 | B1| * | 7/2001  | DeMone et al. ....... | 711/169 |
| 6,275,057 | B1|   | 8/2001  | Takizawa             |         |
| 2002/0166098 | A1 | * | 11/2002 | Chang et al. ......... | 716/1 |

FOREIGN PATENT DOCUMENTS

| DE | 199 48 388   | 10/1998 |
| DE | 19948388 A1  | 10/1998 |
| EP | 0847060 A1   | 6/1998  |
| EP | 0859367 A2   | 8/1998  |

(Continued)

OTHER PUBLICATIONS

Iyengar et al. 'Huffman encoding of test sets for sequential circuits,' IEEE Transactions on Instrumentation and Measurement, Feb. 1998, pp. 21-25, vol. 47, Issue: 1.*

(Continued)

*Primary Examiner*—Guy J. Lamarre
(74) *Attorney, Agent, or Firm*—Fish & Richardson P.C.

(57) ABSTRACT

Testing an integrated circuit (IC) device, for example, an IC that includes an embedded memory, may involve specifying one or more test parameters including at least one of a pipeline depth data (e.g., latency delay information) and a data width data (e.g. corresponding to a data width of an embedded memory), generating a test sequence by associating test parameters with a test pattern, and applying the generated test sequence to the integrated circuit device. A test system for testing ICs having embedded memories may include multiple test patterns and multiple data structures, each data structure defining one or more test parameters including at least one of a pipeline depth and a data width, an algorithmic pattern generator, and software for controlling the algorithmic pattern generator to generate a test sequence by associating a specified data structure with a specified test pattern.

51 Claims, 2 Drawing Sheets

FOREIGN PATENT DOCUMENTS

JP    11-038100    2/1999

OTHER PUBLICATIONS

PCT International Search Report, Apr. 9, 2003.
R. McConnell, U. Möller and D. Richter, "How We Test Siemens' Embedded DRAM Cores," 1998, IEEE.
T. Falter and D. Richter, "Overview of Status and Challenges of System Testing on Chip with Embedded DRAMS," 2000, Elsevier Science Ltd.
J. Dreibelbis, "Processor-Based Built-In Self-Test for Embedded DRAM," 1998, IEEE.
S. Miyano, K. Sato and K. Numata, "Universal Test Interface for Embedded-DRAM Testing," 1999, IEEE.

* cited by examiner

TEST SYSTEM ALGORITHMIC PROGRAM GENERATORS

RELATED APPLICATION

This application claims priority to U.S. Provisional Patent Application No. 60/277,675, filed Mar. 20, 2001, and to U.S. Provisional Patent Application No. 60/277,795, filed Mar. 21, 2001.

BACKGROUND

This application relates to test system algorithmic pattern generators (APGs) for testing circuits, such as integrated-circuit (IC) devices, and more particularly to APGs useful for testing semiconductor embedded arrays and memories (hereinafter "embedded memories").

Test systems for testing IC devices, such as microprocessors, have become increasingly sophisticated, among other reasons, due to an increase in the number and size of embedded memories found in them. The characterization and testing of these embedded memories play a major role in ensuring the performance of these IC devices.

Various different approaches currently exist for characterizing and testing embedded memories. One such approach is to incorporate a Memory Built In Self Test (MBIST) mechanism within the IC device to be tested. An MBIST typically has a limited repertory of test algorithm patterns available that can be used to test the embedded memories of the IC device. An Algorithmic Pattern Generator (APG) is another mechanism that may be used to characterize and test embedded memories. Typically, an APG is used to apply characterization and defect exposure test patterns to a device under test (DUT) in cases where the test system employs a Direct Access Test (DAT) feature that enables direct access to embedded memories for control and observation. For example, in such a test system, the DUT input and output pins generally are routed through internal paths to embedded memories, which are individually controllable as if they were stand-alone memory devices. An example of an APG used in such a test system is described in U.S. Pat. No. 5,883,905, entitled "Pattern Generator with Extended Register Programming," which is incorporated by reference.

There are challenges in applying APG test patterns to embedded memories located within a DUT, especially when the DUT includes several such embedded memories. The characterization and testing of embedded memories usually require generating numerous test patterns for each embedded memory. However, differences between one embedded memory to another within a DUT can increase the number of test patterns that are necessary to characterize and test the embedded memories. An example of such a difference is that pipeline depth often varies from one embedded memory to another. This results in different latency delays, which is the difference between the data input's latency delay and the data output's latency delay of an embedded memory. To account for differing latency delays, the resulting number of APG test algorithm patterns is increased by a factor of the number of different latency delays between various embedded memories in the DUT.

The width of various embedded memories (e.g., 18, 22 and 108 bits wide) also may vary from one embedded memory to another because chip designers tend to optimize use of the silicon area in an IC and therefore usually limit embedded memories to their necessary (minimum) size. Because the width of the data path accessing the data inputs/outputs of these embedded memories is fixed (e.g., 16 and 32 bits wide), multiple accesses and the ability to handle the irregular data word size for each access are usually required. For example, if a particular embedded memory is 18 bits wide and the data path accessing the embedded memory is 16 bits wide, then two accesses are required, with the second access requiring masking of 14 bits, which are un-used. If the masked un-used data bits must be part of the APG test algorithm patterns, then the number of different data widths between various embedded memories will require different sets of APG test algorithm patterns.

The different latency delays and data access widths between various embedded memories may burden conventional test system hardware and software and may cause a significant increase in the time the test system takes to reconfigure between each successive embedded memory test. In addition, test pattern generation often requires a user of the test system to possess extensive knowledge of the test system and the DUT to create efficient test patterns.

SUMMARY

The present inventors recognized that conventional test systems using an MBIST mechanism to characterize and test embedded memories can be ineffective in validating and characterizing the design of a DUT because an MBIST mechanism generally can detect only hard failures of embedded memories. The present inventors further recognized that the detection of hard failures, although worthwhile, might not provide sufficient failure detection to cover all possible embedded memory failure modes, especially for dynamic random access memory (DRAM), which could result in a decrease in quality. The present inventors also recognized that conventional test systems using traditional APGs to characterize and test embedded memories can be cumbersome given the number of complex APG test patterns needed to test different embedded memories, especially embedded memories of various sizes having different pipeline depths and/or data access widths. These differences can cause significant test time increases while the user reconfigures the test system between embedded memory tests.

Consequently, the present inventors developed an APG design, and associated techniques for using an APG, that enable the encapsulation of test algorithm pattern generation separate and independent from latency delay control and irregular data width masking for testing various sizes of embedded memories in a DUT. As used herein, "encapsulation" means that the individual APG resources used in device testing (e.g., latency delay and irregular data width masking) may be controlled and/or specified separately and individually. As a result of such encapsulation, reuse of the elements can be leveraged during the pattern generation process and device testing runtime. Moreover, a generic set of APG test algorithm patterns can be re-used in different products containing embedded memories.

The pattern independent latency delay element permits a user to separately and independently control the latency delay, corresponding to a pipeline depth delta between the inputs and outputs of an embedded memory, from the test pattern generation. This capability to separately and independently control latency delay permits the use of a common set of APG test algorithm patterns, rather than having to generate and use different sets of APG test algorithm patterns to accommodate varying pipeline depths among various embedded memories.

The pattern independent irregular data width masking element permits a user to separately and independently control differing data access widths to the embedded memories within a DUT. For example, in testing a single embedded memory the irregular data width not only can be at the end of a test sequence access, but also can be in the middle of a test sequence access. As another example, the data width between embedded memories can differ. In both cases, the irregular data width mask could be used with the same common set of APG test algorithm patterns to accommodate the irregular data widths (wherever they may occur in a test sequence), rather than having to generate and use different sets of APG test algorithm patterns to accommodate the same varying data widths.

Implementation of the APG design and associated techniques for using an APG described here may include various combinations of the following features.

In one implementation, testing an integrated circuit device includes specifying one or more test parameters including at least one of a pipeline depth data and a data width data, generating a test sequence by associating the one or more test parameters with a test pattern, and applying the generated test sequence to the integrated circuit device. The integrated circuit device to be tested may include one or more embedded memories. In that case, the pipeline depth data may correspond to a pipeline depth of an embedded memory. The pipeline depth data may be a latency delay data to be applied when testing the embedded memory. A data width data may correspond to a data mask.

Testing an integrated circuit device also may include specifying the test pattern, which could include enabling a user to select a desired test pattern from among one or more pre-generated test patterns. Specifying one or more test parameters may include enabling a user to specify one or more data in a data structure. Associating the one or more test parameters may include performing a software binding of the data structure and the test pattern. Applying the generated test sequence to the integrated circuit device can be done to test a first portion of the integrated circuit device, and re-using the test pattern could be done to test a second portion of the integrated circuit device. Re-using the test pattern could include associating the test pattern with a different test parameter. Furthermore, re-using can include specifying at least one of a different pipeline depth data and a different data width data. The first and second portions correspond to different embedded memories in the integrated circuit having different pipeline depths. The first and second portions also can correspond to different embedded memories in the integrated circuit having different data widths.

At least one specified test parameter may include a data width data. In such a case, applying the generated test sequence includes masking at least a portion of the test pattern based on the specified data width data. The masking at least a portion of the test pattern may include using one or more Z-address bits generated by an algorithmic pattern generator.

Likewise, at least one specified test parameter may include a pipeline depth data. In such a case, applying the generated test sequence includes delaying at least a portion of the test pattern by a latency delay corresponding to the specified pipeline depth data. Delaying at least a portion of the test pattern by a latency delay includes passing test pattern bits through a programmable counter.

In another aspect, a test system for testing integrated circuits includes multiple test patterns and multiple data structures. Each data structure defines one or more test parameters including at least one of a pipeline depth and a data width. The test system also includes an algorithmic pattern generator and software for controlling the algorithmic pattern generator to generate a test sequence by associating a specified data structure with a specified test pattern. The test system also can include circuitry to apply the generated test sequence to pins of an integrated circuit being tested. The circuitry may include a programmable counter for imposing a latency delay on the test sequence based on a specified pipeline depth. The multiple test patterns may include different test patterns for testing different portions of an integrated circuit or for testing different integrated circuits. The multiple data structures may include different test parameters corresponding to associated embedded memories to be tested. The software may include instructions to bind a specified data structure with a specified test pattern. The software also can include instructions to mask at least a portion of the test sequence based on a specified data width. The instructions to mask at least a portion of the test sequence may include instructions to vary one or more Z-address bits generated by an algorithmic pattern generator.

In yet another aspect, testing an integrated circuit device includes specifying one or more test parameters including at least a pipeline depth data, generating a test sequence by associating the one or more test parameters with a test pattern, and applying the generated test sequence to the integrated circuit device being tested. The integrated circuit device to be tested may include one or more embedded memories, each of which has a pipeline depth data that corresponds to a pipeline depth of the embedded memory. The pipeline depth data can include a latency delay data to be applied when testing the embedded memory.

Testing an integrated circuit device also may include specifying the test pattern, which could include enabling a user to select a desired test pattern from among one or more pre-generated test patterns. Specifying one or more test parameters can include enabling a user to specify one or more data in a data structure. Associating the one or more test parameters can include performing a software binding of the data structure and the test pattern. Applying the generated test sequence to the integrated circuit device can be done to test a first portion of the integrated circuit device, and re-using the test pattern could be done to test a second portion of the integrated circuit device. Re-using the test pattern could include associating the test pattern with a different pipeline depth data. The first and second portions correspond to different embedded memories in the integrated circuit having different pipeline depths. Applying the generated test sequence also may include delaying at least a portion of the test pattern by a latency delay corresponding to the specified pipeline depth data. Delaying at least a portion of the test pattern by a latency delay comprises passing test pattern bits through a programmable counter.

In another aspect, testing an integrated circuit device may include specifying one or more test parameters including at least a data width data; generating a test sequence by associating the one or more test parameters with a test pattern; and applying the generated test sequence to the integrated circuit device. The integrated circuit device to be tested includes may include an embedded memory. A specified data width data corresponds to a data mask.

Testing an integrated circuit device also may include specifying the test pattern, which could include enabling a user to select a desired test pattern from among one or more pre-generated test patterns. Specifying one or more test parameters may include enabling a user to specify one or more data in a data structure. Associating the one or more test parameters may include performing a software binding of the data structure and the test pattern. Applying the generated test sequence to the integrated circuit device may be done to test a first portion of the integrated circuit device, and may also include re-using the test pattern to test a second portion of the integrated circuit device. Re-using the test pattern includes associating the test pattern with a different data width data.

The first and second portions correspond to different embedded memories in the integrated circuit having different data widths. Applying the generated test sequence also can include masking at least a portion of the test pattern based on the specified data width data. Masking at least a portion of the test pattern may include using a plurality of Z-address bits generated by an algorithmic pattern generator.

In another aspect, machine-readable instructions, embodied in a tangible medium, for controlling an integrated circuit test system, may be specify one or more test parameters including at least one of a pipeline depth data and a data width data, generate a test sequence by associating the one or more test parameters with a test pattern, and apply the generated test sequence to the integrated circuit device.

The instructions for controlling an integrated circuit test system also may include instructions for enabling a user to select a desired test pattern from among one or more pre-generated test patterns. The instruction to specify one or more test parameters may include instructions for enabling a user to specify one or more data in a data structure. The instructions for associating the one or more test parameters can include instructions to bind of the data structure and the test pattern. The instructions for applying the generated test sequence also could include instructions for masking at least a portion of the test pattern based on the specified data width data. The instructions for masking at least a portion of the test pattern can include instructions for varying Z-address bits to be generated by an algorithmic pattern generator. Likewise, the instructions for applying the generated test sequence also could include instructions for delaying at least a portion of the test pattern by a latency delay corresponding to the specified pipeline depth data. The instructions for delaying at least a portion of the test pattern by a latency delay includes instructions for passing test pattern bits through a programmable counter.

The APG design and associated techniques for using an APG described here may provide several advantages. For example, among other advantages, the APG design significantly reduces the test pattern complexity and generation effort. In addition, the APG design provides robust validation and manufacturing defect coverage of embedded memories in devices such as microprocessors or "system on chip" ICs. Further, the APG design allows a user to flexibly and independently change test parameters, such as data access width and latency delay, to a set of common APG test algorithm patterns. This reduces the number of APG patterns that are needed to test various embedded memories having, for example, different pipeline depth deltas. The APG architecture is designed such that test sequences can be generated efficiently and generally without requiring expert knowledge of the test system. Moreover, once a complex test algorithm pattern has been validated, then this pattern can be used for all embedded memories. The pattern will not have to be modified when the basic test algorithm pattern is useful to detect memory fault. Consequently, this pattern can be re-used for all embedded memory testing for all "system on chip" ICs or microprocessors with the same access data width.

The details of one or more embodiments of the invention are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
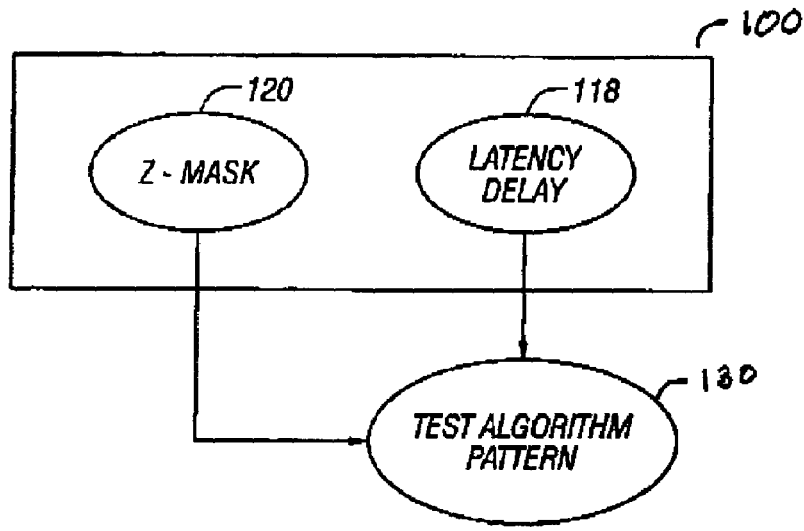
FIG. 1 is a diagram of the encapsulation of APG resources.

FIG. 1 shows an example of encapsulation in which the APG 100 provides Latency Delay 118 and Z-Mask 120, both independent from test algorithm pattern 130, to reduce the complexity and number of test algorithm patterns necessary to characterize and test embedded memories, as well as the overall APG memory that is needed. The Latency Delay 118 can provide from 0 to 15 cycles of latency delay, although more cycles of delay can be provided depending on application and design parameters. The 0 to 15 cycles of latency delay can be used to handle the differences between latency of the APG inputs and the APG outputs that include the data and timing sequence of any test vector. The Z-Mask 120 can provide irregular data width masking. The APG 100 may be a conventional APG, such as the APG described in U.S. Pat. No. 5,883,905, entitled "Pattern Generator with Extended Register Programming," which is incorporated by reference, with the addition of Latency Delay 118 and Z-Mask 120. By providing the Latency Delay 118 and Z-Mask 120 independent of the Test Algorithm Pattern 130, the APG 100 enables the use of generic test algorithm pattern libraries for different embedded memories. Hence, the pattern generation effort is greatly reduced because the same set of patterns can be reused for different DUTs, as well as for different embedded memories within a DUT. This results in an increase in productivity.

Pattern Independent Latency Delay

Figure 2:
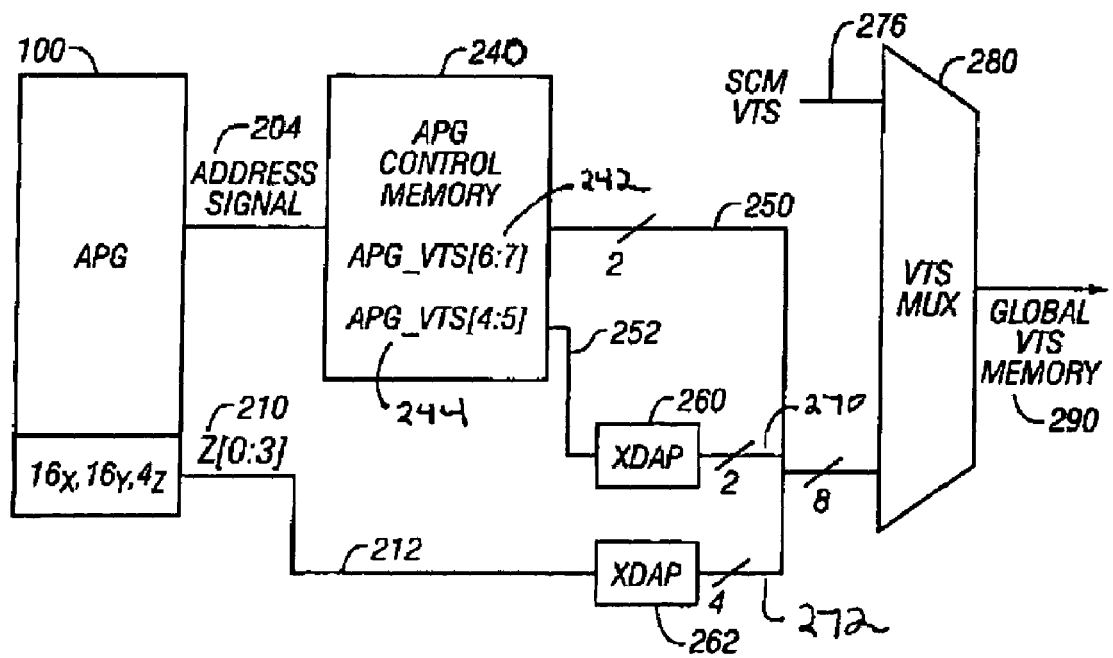
FIG. 2 is a block diagram of APG hardware for supporting latency delay control and irregular data width mask control.

FIG. 2 shows a block diagram of the APG hardware that can provide support for irregular data width masking and 0 to 15 cycles of latency delay for all the data outputs (both data and vector type selection). This APG hardware architecture enables the separation of latency delay from the test algorithm pattern, which enables a user to use generic test algorithm pattern libraries to accomplish characterization and testing for all embedded memories. As a result, the complexity of the test algorithm pattern generation, the number of test algorithm patterns, and the overall APG memory needed can be reduced.

The APG 100 provides an address signal 204 to APG Control Memory 240. The APG Control Memory 240 can be implemented in random access memory (RAM) or other non-volatile memory. The APG Control Memory 240 contains pointers to memory locations in a Global Vector Type Selection (VTS) memory 290, which contains executable timing sequence instructions to be applied to the DUT. The pointers are represented by eight Vector Type Selection (VTS) bits, which in this example include four bits from the APG Control Memory 240 and four bits from an APG Z Address Generator (Z[0:3]) 210, which is provided by a Z-counter located in the APG 100.

The APG Control Memory 240 provides four of its eight Vector Type Selection (VTS) bits—APG_VTS [6:7] 242 and APG_VTS [4:5] 244—on lines 250 and 252, respectively. The APG_VTS [6:7] 242 may be used for address and data inputs, as well as for partitioning the memory locations in the Global VTS Memory 290. This means that the APG_VTS [6:7] 242 supports four vector types for non-latency delayed address and data inputs and for event switching on-the-fly. The APG_VTS [4:5] 244 may be used for data outputs, as well as for partitioning the memory locations in the Global VTS Memory 290. This means that the APG_VTS [4:5] 244 supports four vector types for latency delayed data outputs. As stated above, the Z-counter in the APG 100 generates four bits (Z[0:3]) 210, which are provided on line 212. In particular and explained in detail below, the Z[0:3] 210 can support sixteen choices of data output pin masking controlled by the Z-counter state.

The APG_VTS [4:5] 244 is relayed to an XDAP 260, while the Z[0:3] 210 are received by an XDAP 262. The XDAPs 260, 262 are programmable registers that can provide 0 to 15 cycles of latency delay. The XDAP 260 outputs latency delayed APG_VTS [4:5] on line 270, while the XDAP 262 outputs latency delayed Z[0:3] on line 272. The signals on lines 250, 270, 272 are provided to a programmable VTS Multiplexer 280, which chooses between an 8-bit wide APG test vector signal (i.e., signals on lines 250, 270, 272) and an 8-bit wide Sequence Control Memory (SCM) test vector signal, which is provided via line 276. The output of the VTS Multiplexer 280 is provided to the Global VTS Memory 290. In essence, by pipelining 6 of 8 VTS bits (i.e., the Z[0:3] 210 and the APG_VTS [4:5] 244) for the data outputs, the pattern independent latency delay can be supported.

Test software provides the user the ability to select latency delay values from 0 to 15 test cycles. As stated above, a latency delay can be provided to the XDAPs 260, 262 to delay the output bits from the Z[0:3] 210 and APG_VTS [4:5] 244. In this example, the latency delay value may be provided in a code module, which is referred to as an APG test block, of the test software. The following code module, written in C (although any other language suitable to control test system hardware could be used), generally is suitable to provide a user the ability to independently control the value of the latency delay, among other pattern independent test parameters, such as address scrambling, data inversion, and masking (which is described below):

Apg_block<apg_block_name>{
   ADDRESS_SCRAMBLE=<scramble_block>,
   DATA_INVERSION=<data_inversion_block>,
   APG_MASK=<apg_mask_block>,
   READ_DELAY=<value>,
}.

The "READ_DELAY=<value>" line permits the user to define a latency delay. The user could also create other APG test block modules with different latency delay values. The user can apply any APG test block module to any APG test pattern module. This flexibility allows the user to use the same APG test pattern for various pipelined embedded memories by simply, for example, changing the latency delay value in the line "READ_DELAY=<value>" and applying that APG test block module to the APG test pattern.

Figure 3:
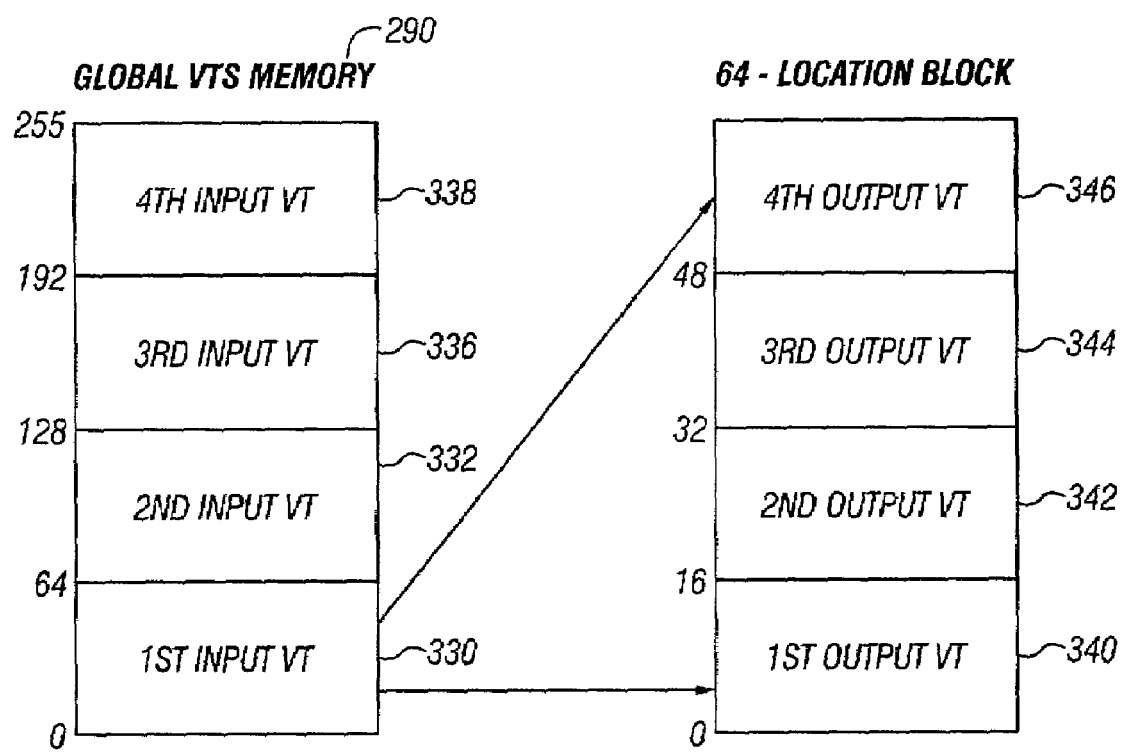
FIG. 3 is a diagram of the input and output vector type memory partition.

The test software also analyzes the user-defined vector definitions of each APG test pattern and applies any input or output timing sequence selection to each APG test pattern. This can be done, for example, by using the 8-bit wide APG test vector signal (i.e., signals on lines 250, 270, 272) outputted from the VTS Multiplexer 280 to partition the Global VTS Memory 290 in a variety ways. FIG. 3 illustrates an input and output vector type memory partition of the Global VTS Memory 290. For each input vector type provided by APG_VTS [6:7] 242, the first input vector type 330 may be stored in VTS locations 0 to 63, the second input vector type 332 may be stored in VTS locations 64 to 127, the third input vector type 336 may be stored in the VTS locations 128 to 191, and the fourth input vector type 338 may be stored in the VTS locations 192 to 255. Each input vector type 330, 332, 336, 338 points to memory locations in which timing sequence information to be applied to a corresponding DUT pin is stored.

For each output vector type provided by the VTS[4:5] 244, the first output vector type 340 may be stored in the first set of 16 locations of each 64-location block (e.g., locations 0 to 15, 64 to 79, 128 to 143, and 192 to 207), the second output vector type 342 may be stored in the second set of 16 locations of each 64-location block (e.g., locations 16 to 31, 80 to 95, 144 to 159 and 208 to 223), the third output vector type 344 may be stored in the third set of 16 locations of each 64-location block (e.g., locations 32 to 47, 96 to 111, 160 to 175, and 224 to 239), and the fourth vector type 346 will be stored in the fourth set of 16 locations of each 64-location block (e.g., locations 48 to 63, 112 to 127, 176 to 191, and 240 to 255). Each output vector type 340, 342, 344, 346 points to memory locations in which timing sequence information that is used during strobing of a DUT output pin is stored.

The hardware and software described above provides the test pattern independent latency delay, which permits a user to use a common set of test algorithm patterns. With such a capability, the complexity of the test algorithm pattern generation, the number of test algorithm patterns, and the overall APG memory needed can be reduced.

Pattern Independent Data Width Masking

The handling of the irregular width of the data access to a DUT's embedded memories may be accomplished by Z-Mask 120, which may be supported as follows. With reference to FIG. 2, a Z-counter located within the APG 100 may be used to produce Z[0:3] 210 to replace the lowest 4 bits of the VTS bits stored in the APG Control Memory 240. An external counter to the APG 100 or any other data width control mechanism also may be used to generate these four bits for mask control. In this example, the Z-counter outputs the signal Z[0:3] 210 on line 212. To accommodate the latency delay, the Z[0:3] 210 is delayed by the delay value stored in the XDAP 262.

The majority of the functionality of the Z-Mask 120 is provided by the test software. With the test software, the user needs to:

Assign the Z-count (i.e., 0 to 15 test cycles) for each different APG output vector in the APG pattern; and Assign the mapping of APG masked data outputs with each Z-count for each embedded memory (which results in the user-defined data pin masking).

Figure 4:
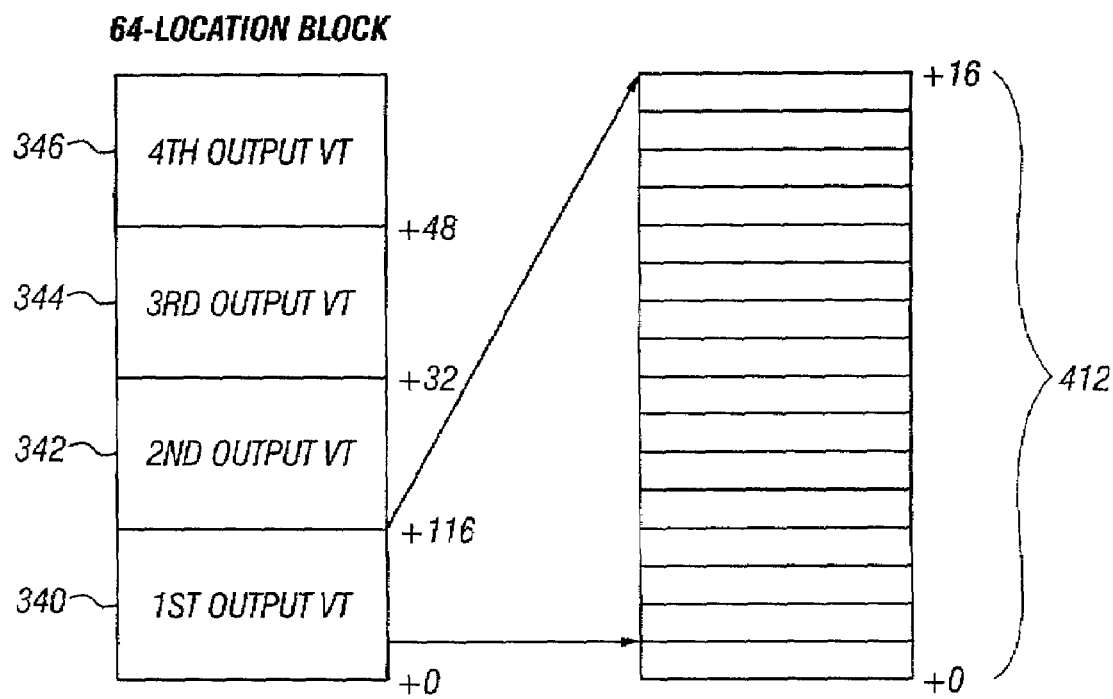
FIG. 4 is a diagram of the Z-Mask's memory partition.

FIG. 4 illustrates the Z-Mask 120's vector type partition within the Global VTS Memory 290. The four bits of the Z[0:3] 210 can be used to select one of the 16 memory locations of each 16-locations block 412 for the user-defined data pin masking. Each 16-locations block 412 can be used as the Z-Mask control timing sequence selection. For example, the Z-counter state of 0 will force the vector types 340, 342, 344, 346 to the 0th location of each 16-locations block 412. As another example, the Z-counter state of 5 will force the output vector types 340, 342, 344, 346 to the 5th location in each 16-locations block 412, and so on. Thus, in this example, there are 16 choices of data output pin masking controlled by the Z-counter state.

The software code, which assigns the Z-masking to each embedded memory, does not include any tester resource constraints. In other words, a user may concentrate on the masking information of the irregular data width for each embedded array or memory. In this example, the Z-masking may be provided in a code module, which is referred to as an APG Mask, of the test software. The following code module, written in C (although any other language suitable to control test system hardware could be used), generally is suitable to provide the Z-masking:

apg_mask <apg_mask_block_name>{
   Z_COUNTER_MASK={
   Z_MASK[0]={<pinset_name>, . . . },
   Z_MASK[1.7]={<pinset_name>, . . . },
   . . .
   Z_MASK[15]{<pinset_name>, . . . },
   }
}

The test software can map the user-defined Z-mask information into the system through timing sequence selection and generation. The timing sequence selection is coordinated into the Z-mask vector type partition as shown in FIG. 4. The timing sequence generation usually will be based on the user-defined timing sequences of each output, which generates all corresponding masking timing sequences per the test resource of the test system. The user does not need to program these specific timing sequences for the purpose of masking. One timing sequence usually will be replicated to a corresponding 16-locations block 412 to support masking operation. The content of each location can be mapped as shown in Table 1. In Table 1, "NOP" means masking enabled at that particular DUT pin, "TF" means compare data at that particular pin, "Index" represents the particular Z-counter state, "n, n+1, n+2, n+3" represent bits of the Z[0:3] 210.

TABLE 1

APG Data Output DUT Pin Timing Generation

| Z[0:3] | | | | DUT Pin | | | | |
| --- | --- | --- | --- | --- | --- | --- | --- | --- |
| n | n+1 | n+2 | n+3 | 1 | 2 | 3 | 4 | Index |
| 1 | 1 | 1 | 1 | TF | TF | TF | TF | 15 |
| 0 | 1 | 1 | 1 | NOP | TF | TF | TF | 14 |
| 1 | 0 | 1 | 1 | TF | NOP | TF | TF | 13 |
| 0 | 0 | 1 | 1 | NOP | NOP | TF | TF | 12 |
| 1 | 1 | 0 | 1 | TF | TF | NOP | TF | 11 |
| 0 | 1 | 0 | 1 | NOP | TF | NOP | TF | 10 |
| 1 | 0 | 0 | 1 | TF | NOP | NOP | TF | 9 |
| 0 | 0 | 0 | 1 | NOP | NOP | NOP | TF | 8 |
| 1 | 1 | 1 | 0 | TF | TF | TF | NOP | 7 |
| 0 | 1 | 1 | 0 | NOP | TF | TF | NOP | 6 |
| 1 | 0 | 1 | 0 | TF | NOP | TF | NOP | 5 |
| 0 | 0 | 1 | 0 | NOP | NOP | TF | NOP | 4 |
| 1 | 1 | 0 | 0 | TF | IF | NOP | NOP | 3 |
| 0 | 1 | 0 | 0 | NOP | TF | NOP | NOP | 2 |
| 1 | 0 | 0 | 0 | TF | NOP | NOP | NOP | 1 |
| 0 | 0 | 0 | 0 | NOP | NOP | NOP | NOP | 0 |

The hardware and software architecture described above provides the test pattern independent data width masking. By separating irregular data width masking from the test algorithm pattern, a user is able to use generic test algorithm pattern libraries to accomplish characterization and testing for all embedded memories. As a result, the complexity of the test algorithm pattern generation, the number of test algorithm patterns, and the overall APG memory needed can be reduced.

In general, the overall capability of this implementation, which can provide both pattern independent latency delay and pattern independent data width masking, could be described as 4 vector types for non-latency delayed address and data inputs, 4 vector types for latency delayed data outputs, and 16 choices of data output pin masking controlled by the Z-counter state.

Other implementations may include different or additional features. For example, as indicated above an external counter to the APG or any other data width control mechanism can be used to generate the four bits for mask control. Moreover, the range of latency delay values can be increased depending on application and design parameters.

The computational aspects described here can be implemented in digital electronic circuitry, or in computer hardware, firmware, software, or in combinations of them. Where appropriate, aspects of these systems and techniques can be implemented in a computer program product tangibly embodied in a machine-readable storage device for execution by a programmable processor; and method steps can be performed by a programmable processor executing a program of instructions to perform functions by operating on input data and generating output.

To provide for interaction with a user, a computer system can be used having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

Other embodiments are within the scope of the following claims.

What is claimed is:

1. A method of testing an integrated circuit device having a plurality of embedded memories, each embedded memory characterized by a data width size and a pipeline depth, the method comprising:
   selecting one of the plurality of embedded memories to test;
   specifying one or more test parameters including at least one of a latency delay data and an irregular data width masking data;
   specifying a test pattern from among a common set of pre-generated algorithmic pattern generator test patterns;
   associating the one or more test parameters with the specified test pattern; and
   applying the associated test pattern to the selected embedded memory, wherein the irregular data width masking data is configured to be specified when the data width size of the selected embedded memory is irregular, further wherein the latency delay data corresponds to a difference between the pipeline depth of an input and an output of the selected embedded memory and the irregular data width masking data corresponds to a portion of a data access of the selected embedded memory to be masked.

2. The method of claim 1 wherein specifying one or more test parameters comprises enabling a user to specify one or more data in a data structure.

3. The method of claim 1 wherein associating the one or more test parameters with the specified test pattern comprises performing a software binding of the data structure and the specified test pattern.

4. The method of claim 1 wherein specifying a test pattern from among a common set of a pre-generated algorithmic pattern generator test patterns comprises enabling a user to select a desired test pattern from among a common set of pre-generated algorithmic pattern generator test patterns.

5. The method of claim 1 wherein applying the associated test pattern to the selected embedded memory tests the selected embedded memory and wherein the method further comprises re-using the specified test pattern to test a different selected embedded memory.

6. The method of claim 5 wherein re-using the specified test pattern comprises associating the specified test pattern with a different test parameter.

7. The method of claim 6 wherein re-using the specified test pattern further comprises specifying at least one of a different latency delay data and a different irregular data width masking data.

8. The method of claim 5 wherein the selected embedded memory and the different selected embedded memory have different pipeline depths.

9. The method of claim 5 wherein the selected embedded memory and the different selected embedded memory have different latency delay data.

10. The method of claim 5 wherein the selected embedded memory and the different selected embedded memory have different data width sizes.

11. The method of claim 1 wherein at least one of the specified one or more test parameters comprises the irregular data width masking data, and wherein applying the associated test pattern comprises masking at least a portion of the associated test pattern based on the specified irregular data width masking data.

12. The method of claim 11 wherein masking at least a portion of the associated test pattern comprises using a plurality of Z-address bits generated by an algorithmic pattern generator.

13. The method of claim 1 wherein at least one specified test parameter comprises a latency delay data, and wherein applying the associated test pattern comprises delaying at least a portion of the associated test pattern based on the specified latency delay data.

14. The method of claim 13 wherein delaying at least a portion of the associated test pattern based on the specified latency delay data comprises passing one or more bits of the associated test pattern through a programmable counter.

15. A test system for testing integrated circuits, each integrated circuit having a plurality of embedded memories, the system comprising:
a common set of predetermined algorithmic pattern generator test patterns;
a plurality of data structures, each data structure defining one or more test parameters including at least one of a latency delay data and an irregular data width masking data, wherein the latency delay data corresponds to a pipeline depth difference between an input and an output of a specified embedded memory and the irregular data width masking data corresponds to a portion of a data width access or the specified embedded memory to be masked;
an algorithmic pattern generator; and
software for controlling the algorithmic pattern generator to generate a specified test pattern from among the common set or predetermined algorithmic pattern generator test patterns and associate a specified data structure with the generated test pattern.

16. The system of claim 15 further comprising circuitry to apply the generated test pattern to pins of the specified embedded memory of the integrated circuit.

17. The system of claim 16 wherein the circuitry comprises a programmable counter for imposing a timing delay on the selected test pattern based on a specified latency delay data.

18. The system of claim 15 wherein the common set of predetermined algorithmic pattern generator test patterns is configured to be used to test each embedded memory of the integrated circuit.

19. The system of claim 15 wherein the common set of predetermined algorithmic pattern generator test patterns is configured to be used to test each integrated circuit.

20. The system of claim 15 wherein the plurality of data structures comprises different test parameters corresponding to associated embedded memories to be tested.

21. The system of claim 15 wherein the software comprises instructions to bind the specified data structure with the generated test pattern.

22. The system of claim 15 wherein the software for controlling the algorithmic pattern generator comprises instructions to mask at least a portion of the generated test pattern based on a specified irregular data width masking data.

23. The system of claim 22 wherein the instructions to mask at least a portion of the generated test pattern comprise instructions to vary a plurality of Z-address bits generated by the algorithmic pattern generator.

24. A method of testing an integrated circuit device having a plurality of embedded memories, the method comprising:
selecting one of the plurality of embedded memories to be tested;
specifying a plurality of test parameters including at least a latency delay data and an irregular data width masking data;
specifying a test pattern from among a set of predetermined algorithmic pattern generator test patterns configured to be used for testing the plurality of embedded memories; and
applying the specified test pattern to the selected embedded memory based on the plurality of specified test parameters.

25. The method of claim 24 wherein the latency delay data corresponds to a pipeline depth difference between inputs and outputs of the selected embedded memory.

26. The method of claim in 24 wherein specifying a plurality of test parameters comprises enabling a user to specify a plurality of data in a data structure.

27. The method of claim 24 wherein applying the specified test pattern to the selected embedded memory the selected embedded memory and wherein the method further comprises re-using the specified test pattern to test a different selected embedded memory.

28. The method of claim 27 wherein re-using the specified test pattern comprises associating the specified test pattern with a different latency delay data.

29. The method of claim 27 wherein the selected embedded memory and the different selected embedded memory have different pipeline depths.

30. The method of claim 27 wherein the selected embedded memory and the different selected embedded memory have different pipeline depth differences between inputs and outputs.

31. The method of claim 24 wherein applying the specified test pattern to the selected embedded memory based on the plurality of one or more test parameters comprises delaying at least a portion of the specified test pattern by a timing delay corresponding to the specified latency delay data.

32. The method of claim 31 wherein delaying at least a portion of the specified test pattern by a timing delay comprises passing one or more bits of the specified test pattern through a programmable counter.

33. A method of testing an integrated circuit device having a plurality of embedded memories, the method comprising:
selecting one of the plurality of embedded memories;
specifying one or more test parameters including at least an irregular data width masking data;
selecting a test pattern from a group of predetermined algorithmic pattern generator test patterns;
generating a test sequence by associating the one or more test parameters with the selected test pattern; and
applying the generated test sequence to the selected embedded memory.

34. The method of claim 33 wherein specifying one or more test parameters comprises enabling a user to specify one or more data in a data structure.

35. The method of claim 33 wherein associating the one or more test parameters with the selected test pattern comprises performing a software binding of the data structure and the selected test pattern.

36. The method of claim 33 wherein selecting a test pattern from a group of predetermined algorithmic pattern generator test patterns comprises enabling a user to select a desired test pattern from among a plurality of pre-generated test patterns.

37. The method of claim 33 wherein applying the generated test sequence to the selected embedded memory tests the selected embedded memory and wherein the method further comprises re-using the selected test pattern to test a different selected embedded memory of the integrated circuit device.

38. The method of claim 37 wherein re-using the selected test pattern comprises associating the selected test pattern with a different irregular data width masking data.

39. The method of claim 37 wherein the selected embedded memory and the different embedded memory have different data bit width sizes.

40. The method of claim 33 wherein applying the generated test sequence comprises masking at least a portion of the selected test sequence based on the specified irregular data width masking data.

41. The method of claim 40 wherein masking at least a portion of the selected test sequence comprises using a plurality of Z-address bits generated by an algorithmic pattern generator.

42. Machine-readable instructions, embodied in a tangible medium, for testing an integrated circuit having a plurality of embedded memories, the instructions causing a machine to perform operations comprising:
receive a selection of an embedded memory to test;
receive one or more test parameters including at least one of a latency delay data and an irregular data width masking data;
select a test pattern from a common group of pre-generated algorithmic pattern generator test patterns;
generate a test sequence by associating the one or more received test parameters with the selected test pattern; and
apply the generated test sequence to the embedded memory to test.

43. The instructions of claim 42 wherein the latency delay data corresponds to a pipeline depth of the embedded memory to test.

44. The instructions of claim 42 wherein the latency delay data corresponds to a pipeline depth difference between inputs and outputs of the embedded memory to test.

45. The instructions of claim 42 wherein the irregular data width masking data corresponds to a portion of a data access of the selected embedded memory to be masked.

46. The instructions of claim 42 wherein the instructions to receive one or more test parameters comprise instructions to enable a user to specify one or more data in a data structure.

47. The instructions of claim 42 wherein the instructions for associating the one or more received test parameters comprise instructions to bind the data structure and the selected test pattern.

48. The instructions of claim 42 wherein at least one received test parameter comprises the irregular data width masking data, and wherein the instructions to apply the generated test sequence comprise instructions to mask at least a portion of the test sequence based on the received irregular data width masking data.

49. The instructions of claim 48 wherein the instructions to mask at least a portion of the test sequence comprise instructions to vary Z-address bits to be generated by an algorithmic pattern generator.

50. The instructions of claim 42 wherein at least one received test parameter comprises a latency delay data, and wherein the instructions to apply the generated test sequence comprise instructions to delay at least a portion of the test sequence by a timing delay corresponding to the received latency delay data.

51. The instructions of claim 50 wherein the instructions to delay at least a portion of the test sequence by a timing delay comprise instructions to pass one or more test sequence bits through a programmable counter.

* * * * *